United States Patent
Lin et al.

(10) Patent No.: US 9,787,331 B1
(45) Date of Patent: Oct. 10, 2017

(54) DECODING PATH SELECTION DEVICE AND METHOD

(71) Applicant: YUAN ZE UNIVERSITY, Chung-Li (TW)

(72) Inventors: Cheng-Hung Lin, New Taipei (TW); Tsung-Ju Hsieh, Hsinchu (TW)

(73) Assignee: YUAN ZE UNIVERSITY, Chung-Li (TW)

( * ) Notice: Subject to any disclaimer, the term of this patent is extended or adjusted under 35 U.S.C. 154(b) by 0 days.

(21) Appl. No.: 15/224,939

(22) Filed: Aug. 1, 2016

(30) Foreign Application Priority Data

Apr. 6, 2016 (TW) .............................. 105110686 A (51) Int. Cl.
*H03M 13/03* (2006.01)
*H03M 13/39* (2006.01)
*H03M 13/23* (2006.01)
*H03M 13/25* (2006.01)
*H03M 13/41* (2006.01)

(52) U.S. Cl.
CPC ....... *H03M 13/3961* (2013.01); *H03M 13/23* (2013.01); *H03M 13/258* (2013.01); *H03M 13/4161* (2013.01)

(58) Field of Classification Search
CPC .. H03M 13/03; H03M 13/41; H03M 13/3961; H03M 13/23; H03M 13/4161; H03M 13/2957; H04L 1/0054; H04L 1/0047; H04L 1/0059
See application file for complete search history.

(56) References Cited

U.S. PATENT DOCUMENTS

| 7,529,324 B2 * | 5/2009 | Higashino ............. H03M 13/39 375/262 |
| 2002/0174402 A1 * | 11/2002 | Yamamoto ........ H03M 13/3961 714/795 |

(Continued)

OTHER PUBLICATIONS

Fan-Min Li et al., Unified Convolutional/Turbo Decoder Design Using Tile-Based Timing Analysis of VA/MAP Kernel, IEEE Trans. Very Large Scale Integration (VLSI) Systems, vol. 16, No. 10, pp. 1358-1371, Oct. 2008.

*Primary Examiner* — Christine Tu
(74) *Attorney, Agent, or Firm* — Locke Lord LLP; Tim Tingkang Xia, Esq.

(57) ABSTRACT

The present invention discloses a decoding path selection device for decoding codewords generated by convolutional codes or turbo codes encoders in error correction codes, the decoding path selection device comprising: a branch metrics calculation unit for receiving incoming signals and calculating branch metrics values; a programmable generalized trellis router for generating a decoding path control signal according to the turbo code or convolutional code specification employed by one of communications standards; a multiplexer for receiving the branch metrics values from the branch metrics calculation unit and the decoding path control signal from the programmable generalized trellis router and selecting a corresponding branch metrics value; a recursive calculation unit, connected after the multiplexer and for receiving the corresponding branch metrics value from the multiplexer; and an a-posteriori probability calculation unit, connected after the recursive calculation unit and for calculating a final decoding result.

18 Claims, 12 Drawing Sheets

(56) References Cited

U.S. PATENT DOCUMENTS

2011/0110469 A1* 5/2011 Liu ................ H04L 1/0054
375/341
2011/0307767 A1* 12/2011 Kelin ................ H03M 13/41
714/795

* cited by examiner

DECODING PATH SELECTION DEVICE AND METHOD

This application claims the benefit of Taiwan Patent Application Serial No. 105110686, filed Apr. 6, 2016, the subject matter of which is incorporated herein by reference.

BACKGROUND OF INVENTION

1. Field of the Invention

The present invention relates to a decoding path selection device and method and, more particularly, to a decoding path selection device and method for decoding codewords generated by convolutional codes encoders or turbo codes encoders in error correction codes.

2. Description of the Prior Art

In recent years, due to the booming of the communications industry, the number of mobile devices increases substantially. In order to enhance the quality of multimedia video/audio processing and high speed wireless communication, turbo codes or convolutional codes would be added as error correction codes to communications standards, correcting signals from errors caused by channel interference. HomePlug is instituted for applications in power transmission communications standards of intelligent electrical net. Besides, various wireless communications standards are instituted one after another. Take the following for example, IEEE 802.16d/m/e (WiMAX) and IEEE 802.11 a/b/g/n/ac (WiFi) for short distance wireless communication, LTE (Long Term Evolution), LTE-A (LTE-Advanced), etc. Each communications standard may not necessarily employ the same turbo codes or convolutional codes specification. At the cost consideration of hardware design, the hardware can only be designed for one or few dedicated specifications.

Portable electronic products such as smart phones and tablet computers are flourishing in a global scale. In existing wireless communication technology, Viterbi algorithm and Maximum a-posteriori probability algorithm are often used in convolutional codes and turbo codes decoders. However, in order to correctly decoding the received information, average decoders are designed with respect to the survival path or trellis diagram corresponding to just one or several types of encoders, and the dedicated decoders could only support the decoding for certain encoders. Thus, when codewords different from target communications standards are received, information sent by the sender could not be successfully restored. If one wants to design decoders with different communications standards, the design complexity or the area overhead of decoders could increase substantially, even to the point of influencing operating frequency and thus reducing throughput.

In view of the fact that the conventional embedded trellis router only supports radix-2 single binary encoding and needs a lot of setup time before the decoding starts, the throughput is thus reduced. The present invention presents a radix-4, low latency embedded trellis router supporting single binary or double binary encoding.

SUMMARY OF THE INVENTION

The present invention provides a decoding path selection device and method for decoding codewords generated by convolutional codes or turbo codes encoders in error correction codes. The present invention not only arranges decoding for double binary turbo codes, but also reduces the setup time for multiple memory units. The present invention could improve the flexibility for convolutional codes and turbo codes decoders and reduce design process for convolutional codes and turbo codes decoders as well.

According to one embodiment of the present invention, a decoding path selection device for decoding codewords generated by convolutional codes or turbo codes encoders in error correction codes is disclosed. The decoding path selection device comprises the following: a branch metrics calculation unit for receiving incoming signals and calculating branch metrics values; a programmable generalized trellis router for generating a decoding path control signal according to the turbo code or convolutional code specification employed by one of communications standards; a multiplexer for receiving the branch metrics values from the branch metrics calculation unit and the decoding path control signal from the programmable generalized trellis router and selecting a corresponding branch metrics value; a recursive calculation unit, connected after the multiplexer and for receiving the corresponding branch metrics value from the multiplexer; and an a-posteriori probability calculation unit, connected after the recursive calculation unit and for calculating a final decoding result.

According to another embodiment of the present invention, a decoding path selection method for decoding codewords generated by convolutional codes or turbo codes encoders in error correction codes is disclosed. The decoding path selection method comprises the following steps: receiving a plurality of incoming signals; calculating a plurality of branch metrics values; generating a decoding path control signal according to the turbo code or convolutional code specification employed by one of a plurality of communications standards; receiving the branch metrics values and the decoding path control signal and selecting a corresponding branch metrics value; receiving the corresponding branch metrics value; and calculating a final decoding result.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Reference will now be made in detail to this disclosure, examples of which are illustrated in the accompanying drawings. Wherever possible, the same reference numbers are used in the drawings and the description to refer to the same or like parts.

Turbo codes and convolutional codes are prevalently used in international wireless communications standards nowadays. Take the following for example, Long Term Evolution Advanced (LTE-A) for the fourth generation of mobile communications technology, WiMAX (IEEE 802.16d/e/m), WiFi (802.11 a/b/g/n/ac), and HomePlug. The technology of the present invention could be applied to convolutional codes and turbo codes instituted by any communications standards, not limited to certain standards.

Figure 1:
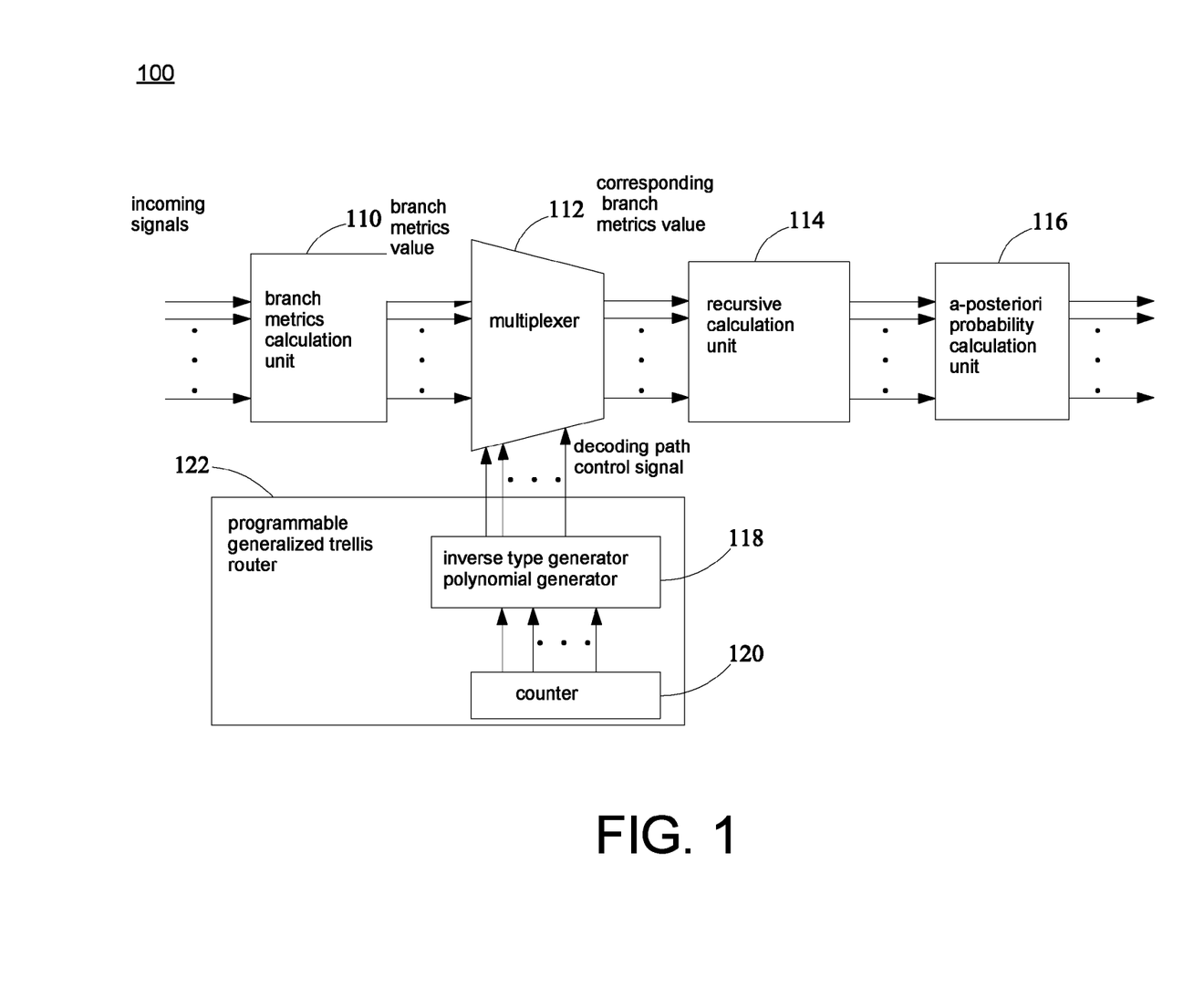
FIG. 1 illustrates one example of the decoding path selection device according to one embodiment of the present invention.

Please refer to FIG. 1. FIG. 1 illustrates one example of the decoding path selection device according to one embodiment of the present invention. The present invention discloses a decoding path selection device for decoding codewords generated by convolutional codes or turbo codes encoders in error correction codes. The decoding path selection device 100 comprises a branch metrics calculation unit 110 for receiving input signals and calculating branch metrics values; a programmable generalized trellis router 122 for generating a decoding path control signal according to the turbo code or convolutional code specification employed by one of communications standards; a multiplexer 112 for receiving the branch metrics values from the branch metrics calculation unit 110 and the decoding path control signal from the programmable generalized trellis router 122 and selecting a corresponding branch metrics value; a recursive calculation unit 114, connected after the multiplexer 112 and for receiving the corresponding branch metrics value from the multiplexer 112; and an a-posteriori probability calculation unit 116, connected after the recursive calculation unit 114 and for calculating a final decoding result. The programmable generalized trellis router 122 supports both Radix-4 and Radix-2 architecture.

In the embodiment of single binary encoding, the programmable generalized trellis router 122 includes a counter 120 and an inverse type generator polynomial generator 118. The counter 120 includes memory units, the number of memory units is greater than or equal to the constraint length of the corresponding encoder.

In the embodiment of double binary encoding, the programmable generalized trellis router 122 includes a counter 120 and an inverse type generator polynomial generator 118. The counter 120 includes memory units, the number of memory units is greater than or equal to (the constraint length plus one) of the corresponding encoder.

The inverse type generator polynomial generator 118 is for receiving inputs from the memory units and generating an inverse type generator polynomial via a generator polynomial of the corresponding encoder, wherein the result generated by the inverse type generator polynomial is the decoding path control signal. The inverse type generator polynomial supports recursive or non-recursive, systematic or non-systematic convolutional encoders for application in turbo codes. The inverse type generator polynomial supports recursive or non-recursive, systematic or non-systematic convolutional encoders for application in convolutional codes.

The decoding path selection device 100 is configured to be adapted to a Viterbi decoder. In one embodiment of the Viterbi decoder, the Viterbi decoder further includes a path tracking module. The decoding path selection device 100 can also be configured to be adapted to a Maximum a-posteriori probability decoder.

Figure 2:
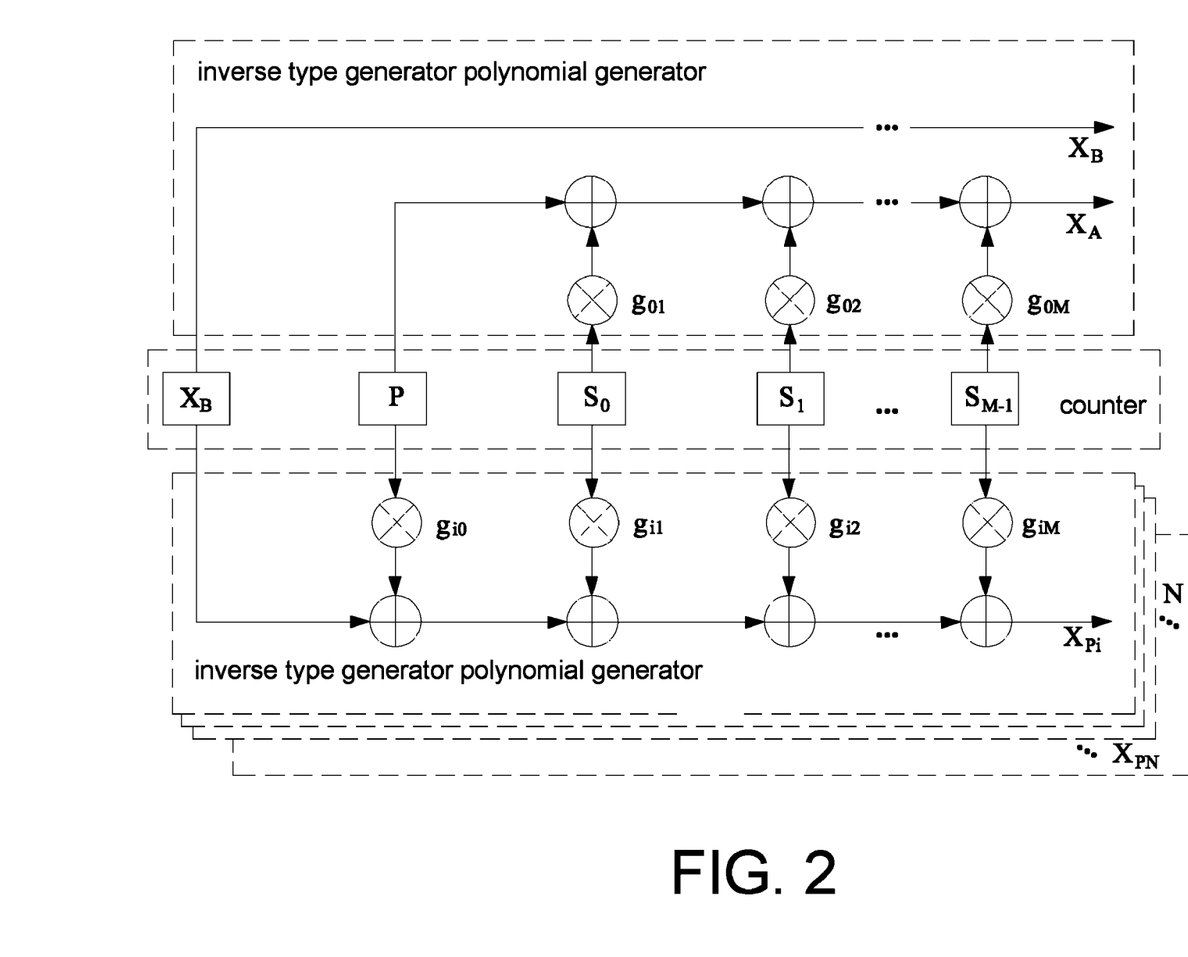
FIG. 2 illustrates one example of the programmable generalized trellis router according to one embodiment of the present invention.

Please refer to FIG. 2. FIG. 2 illustrates one example of the programmable generalized trellis router according to one embodiment of the present invention. $X_B$ is a memory unit set up for the second input in the double binary turbo codes. P, $S_0$, $S_1$, ... $S_{M-1}$ are memory units commonly used by all encoding. $X_B$ at the output is for the output of double binary turbo codes. $X_A$ is for the systematic bit output of turbo codes, and the rest are for the outputs commonly used by all encoding. $X_{PN}$ below could be used to adjust various output numbers according to different standards. The parameter $g_{iM}$ next to the multiplier could adjust the generator polynomial of different standards to 1 or 0 in order to form inverse type generator polynomial for different encoders.

Regarding throughput decrease, a trellis diagram is used to arrange the decoding path whether a Maximum a-posteriori probability decoder or a Viterbi decoder is used to decode convolutional codes or turbo codes. Thus, after the decoding path is rearranged, a Viterbi decoder can decode all convolutional codes with different standards correctly. If the number of states a processor can process simultaneously is huge enough, the throughput of decoding convolutional codes of various standards would not decrease. Similarly, after the decoding path is rearranged, an a-posteriori probability decoder can decode all convolutional or turbo codes standards. If the decoder is capable enough to decode various error correction codes, the throughput would not decrease.

Figure 3:
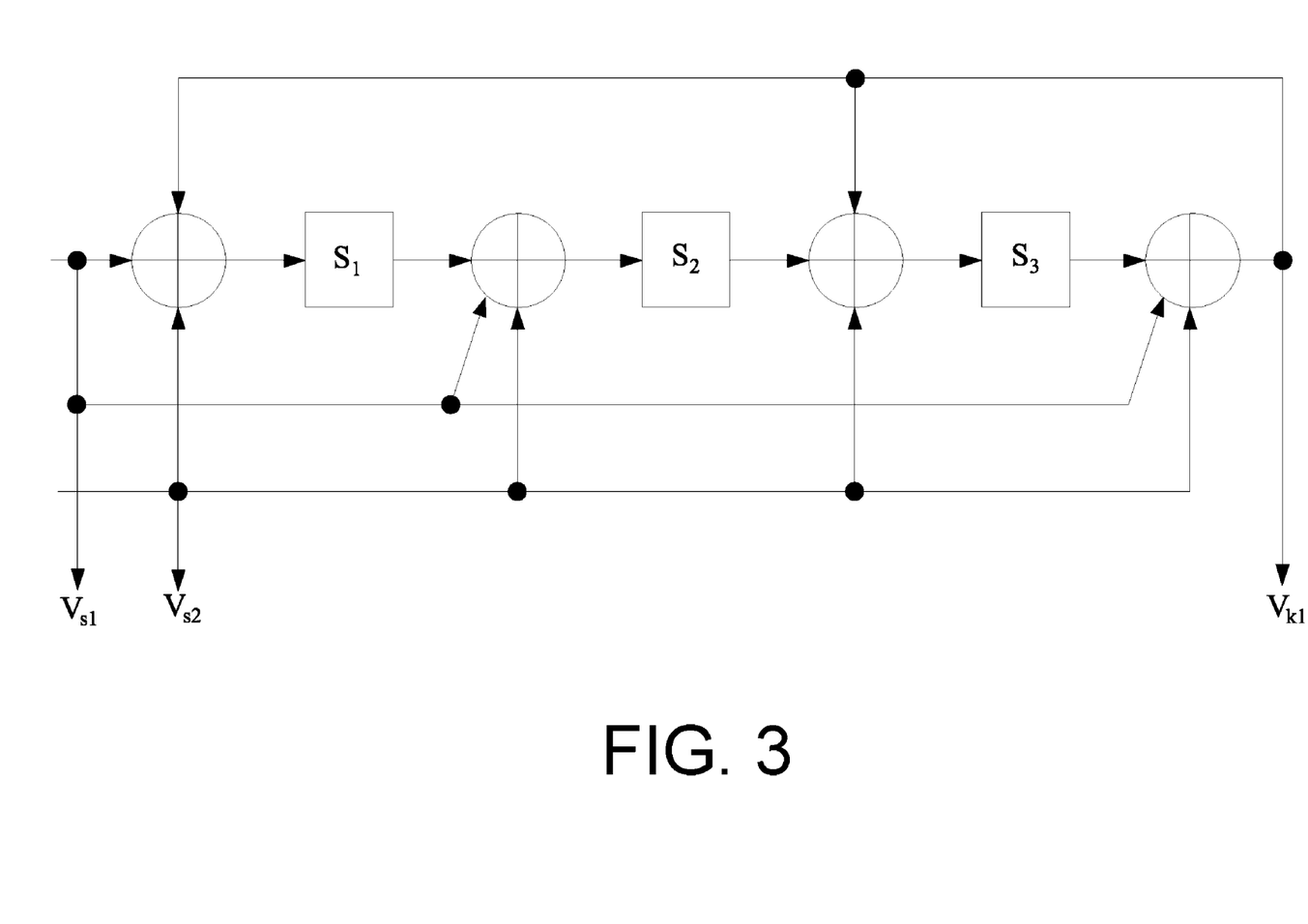
FIG. 3 illustrates one recursive systematic convolutional encoder for application in HomePlug turbo codes according to one embodiment of the present invention.
Figure 4:
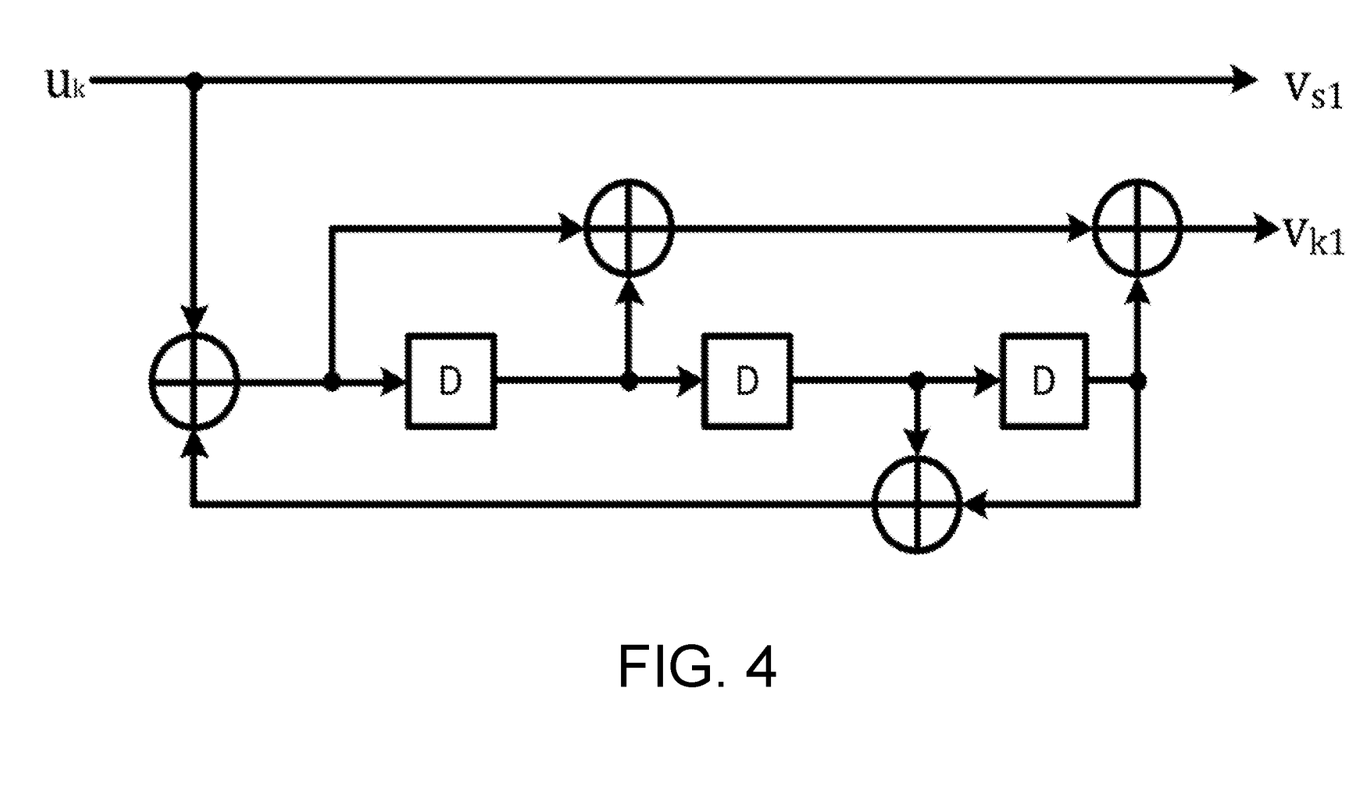
FIG. 4 illustrates one recursive systematic convolutional encoder for application in LTE turbo codes according to one embodiment of the present invention.

Take HomePlug, LTE and WiMAX for example. Please refer to FIG. 3 to FIG. 5. FIG. 3 illustrates one recursive systematic convolutional encoder for application in HomePlug turbo codes according to one embodiment of the present invention. FIG. 4 illustrates one recursive systematic convolutional encoder for application in LTE turbo codes according to one embodiment of the present invention. FIG.

Figure 5:
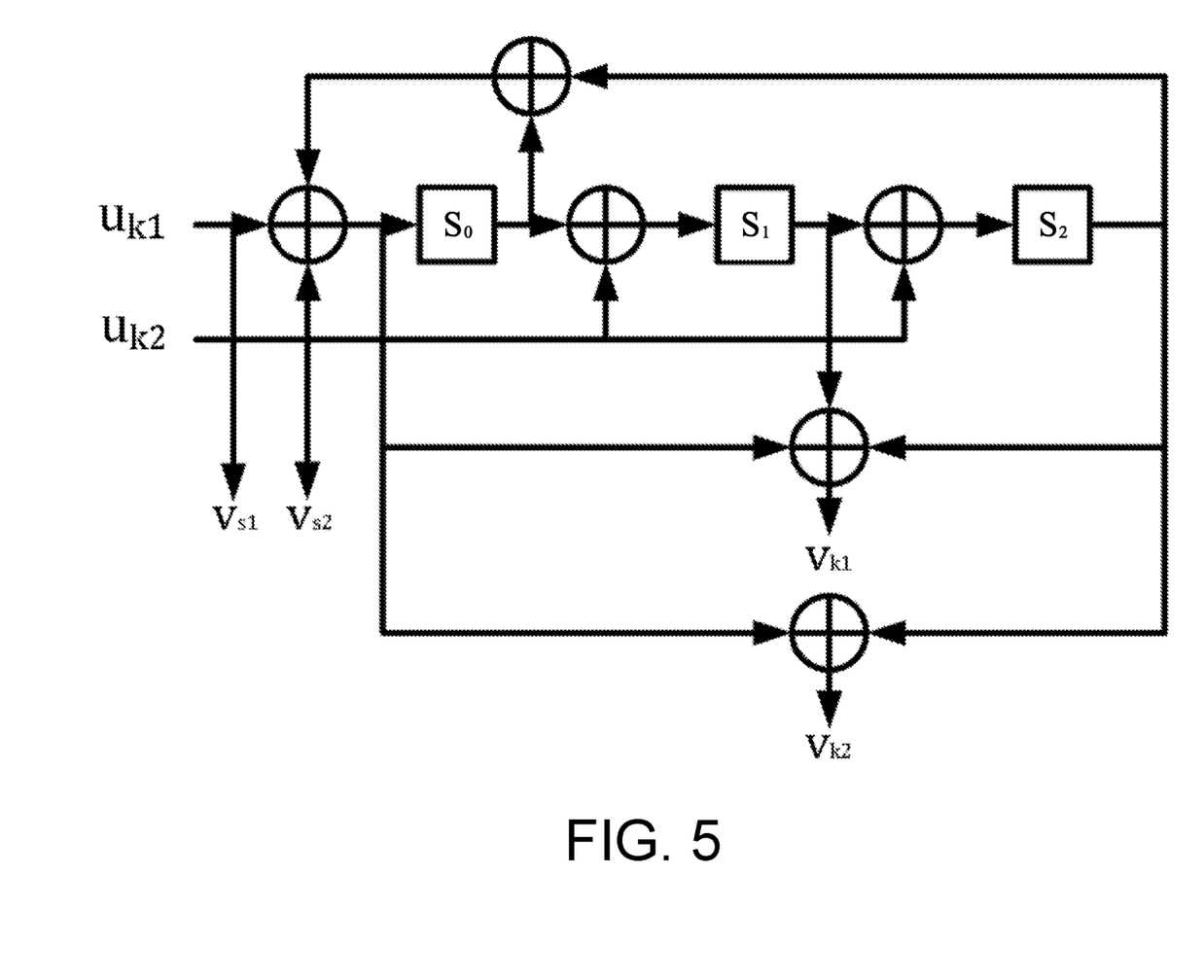
FIG. 5 illustrates one recursive systematic convolutional encoder for application in WiMAX turbo codes according to one embodiment of the present invention.
Figure 6:
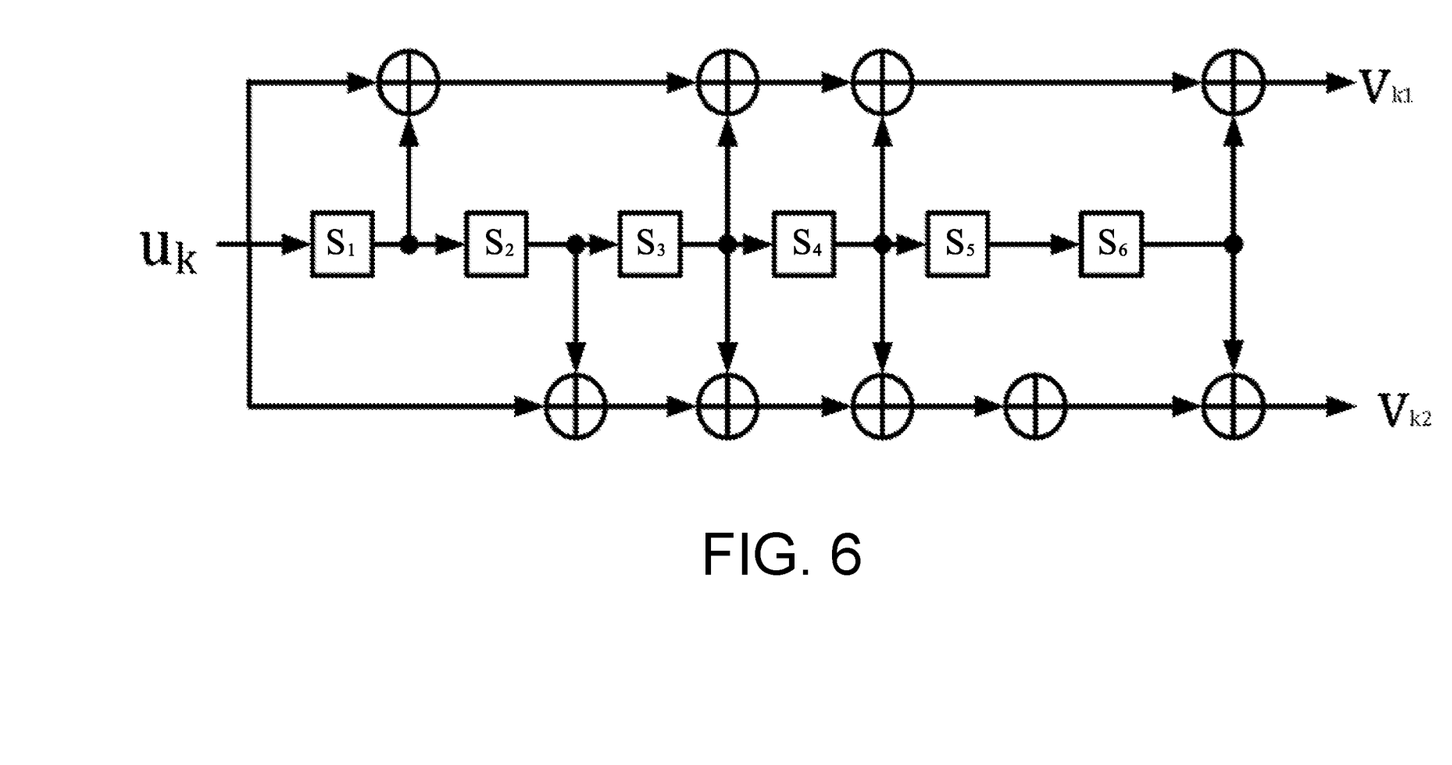
FIG. 6 illustrates one non-recursive non-systematic convolutional encoder for application in LTE convolutional codes according to one embodiment of the present invention.

5 illustrates one recursive systematic convolutional encoder for application in WiMAX turbo codes according to one embodiment of the present invention. FIG. 6 illustrates one non-recursive non-systematic convolutional encoder for application in LTE convolutional codes according to one embodiment of the present invention. The codewords encoded via HomePlug, LTE and WiMAX have to be decoded via different, dedicated Maximum a-posteriori probability decoders to achieve the information protection effect of forward-error-correction, wherein $V_{s1}$, $V_{s2}$ are bits for the systematic output, and $V_{k1}$, $V_{k2}$ are bits for the parity output. HomePlug and WiMAX are double binary encoding structure, while LTE is single binary encoding structure.

With respect to the classification of feedback paths in the encoder, LTE and WiMAX convolutional encoders are both multi-bit single-output feedback patterns, while HomePlug convolutional encoders are single-bit multi-output feedback patterns. If the encoder is multi-bit single-output feedback pattern, the corresponding register positions of each bit stay the same when the encoder is transformed into the programmable generalized trellis router. During the transformation process, each state would not be changed. For example, the corresponding positions of $S_0$, $S_1$, and $S_2$ of WiMAX convolutional encoders stay in the same order of $S_0$, $S_1$, and $S_2$ after the transformation. Therefore, the state values of the counter set could be directly applied to the programmable generalized trellis router. If the convolutional encoder is single-bit multi-output feedback pattern, the corresponding register positions of each bit might change when the encoder is transformed into the programmable generalized trellis router. For example, the corresponding positions of $S_0$, $S_1$, and $S_2$ of HomePlug convolutional encoders might be changed to the order of $S_2$, $S_1$, and $S_0$ after the transformation. Therefore, state transformation circuits need to be added after the transformation.

Figure 7:
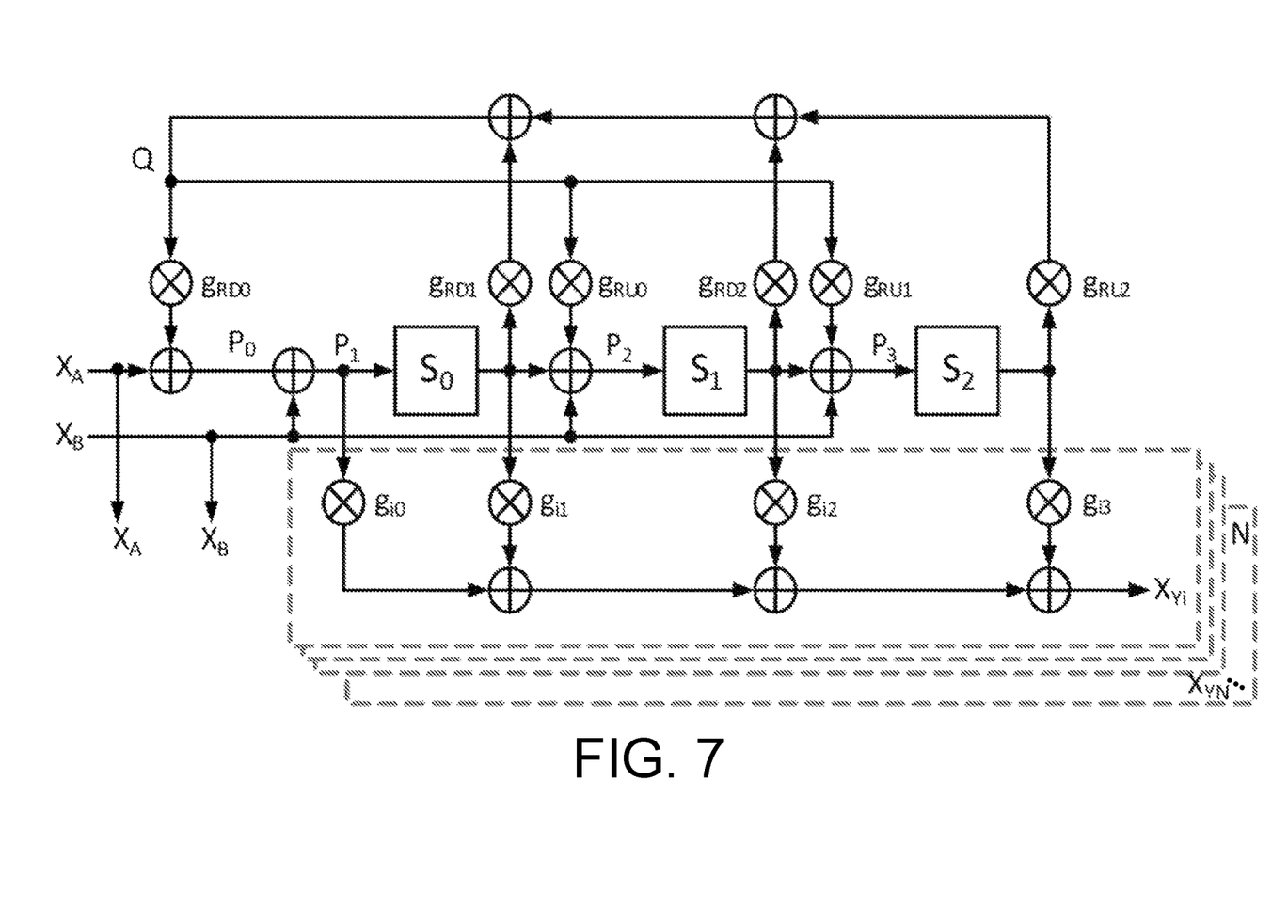
FIG. 7 illustrates one generalized recursive convolutional encoder with three memory units and the multi-bits multi-outputs feedback pattern according to one embodiment of the present invention.

Please refer to FIG. 7. FIG. 7 illustrates one generalized recursive convolutional encoder with three memory units and the multi-bits multi-outputs feedback pattern according to one embodiment of the present invention, wherein $g_{RDN}$ represents the input control parameter of the feedback path, and $g_{RDN}$ represents the output position of the feedback path. By adjusting these two parameters, the generalized encoder could become a recursive convolutional encoder of any pattern.

Figure 8:
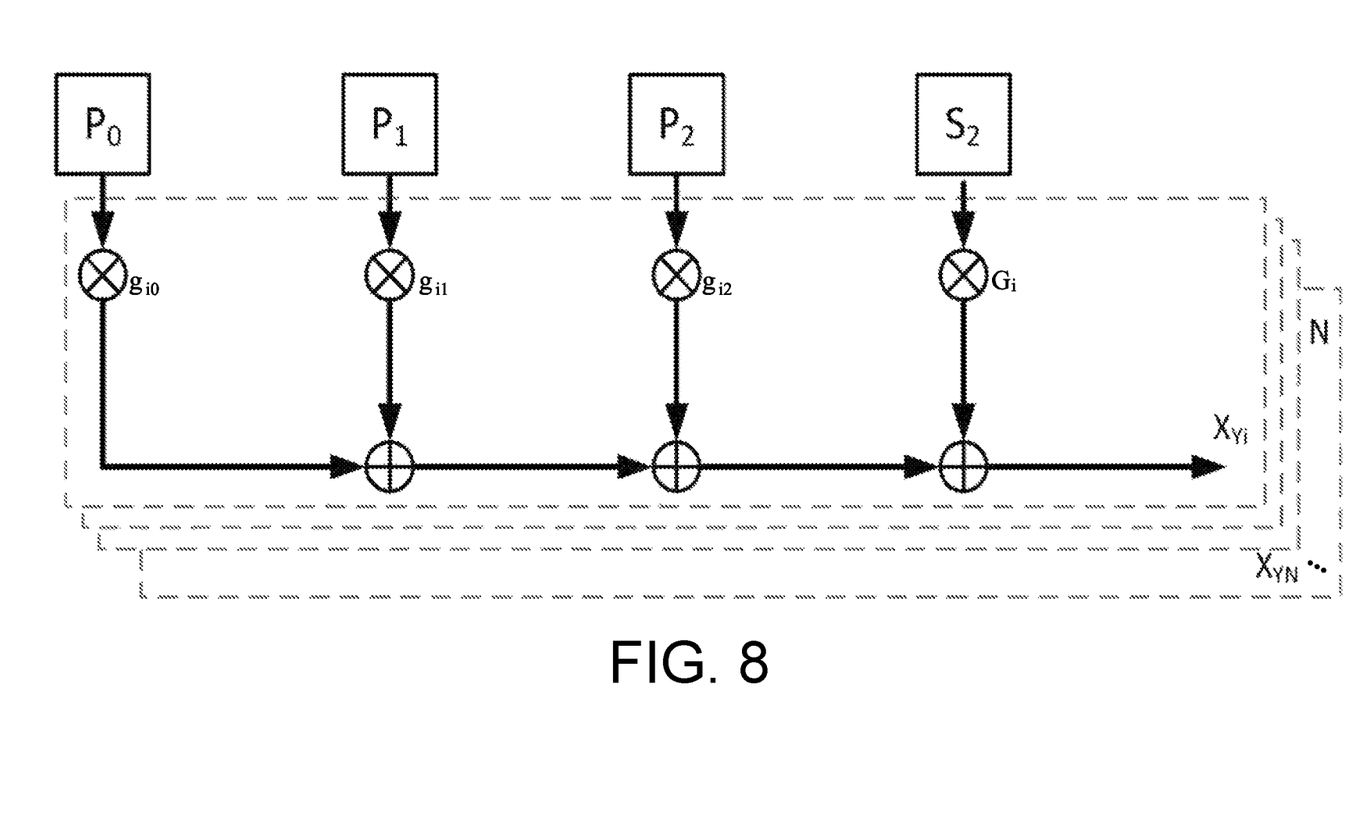
FIG. 8 illustrates bits for parity output of the programmable generalized trellis router transformed from generalized recursive convolutional encoder feedback by multi-bits multi-outputs according to one embodiment of the present invention.

Please refer to FIG. 8. FIG. 8 illustrates bits for parity output of the programmable generalized trellis router transformed from generalized recursive convolutional encoder feedback by multi-bits multi-outputs according to one embodiment of the present invention. In consideration of the multi-output feedback path, the first three bits in the register would be replaced to ones different from the original pattern after the transformation. The input, $S_0$, and $S_1$ are transformed into various logic combinations such as $P_0$, $P_1$, and $P_2$. The original inputs could be replaced by a set of additional logic units, and thus the patterns of registers are transformed into the patterns of counters.

The following smart phone scenario will exemplify one embodiment of the present invention. Generally speaking, the error correction codes on a smart phone might be turbo codes encoders designed for one single wireless communications standard such as LTE, or WiMAX, wherein a Viterbi decoder or a Maximum a-posteriori probability decoder is used to decode. According to various types of encoders, the present invention could arrange the branch metrics values calculated by the branch metrics calculation unit of a Viterbi decoder or a Maximum a-posteriori probability decoder. Then, the branch metrics values would be sent to the recursive calculation unit, and finally into the a-posteriori probability calculation unit to calculate a final decoding result. By arranging routes appropriately, as opposed to the decoder designed for just one single standard, the decoder could decode turbo codes or convolutional codes of various standards.

Figure 9:
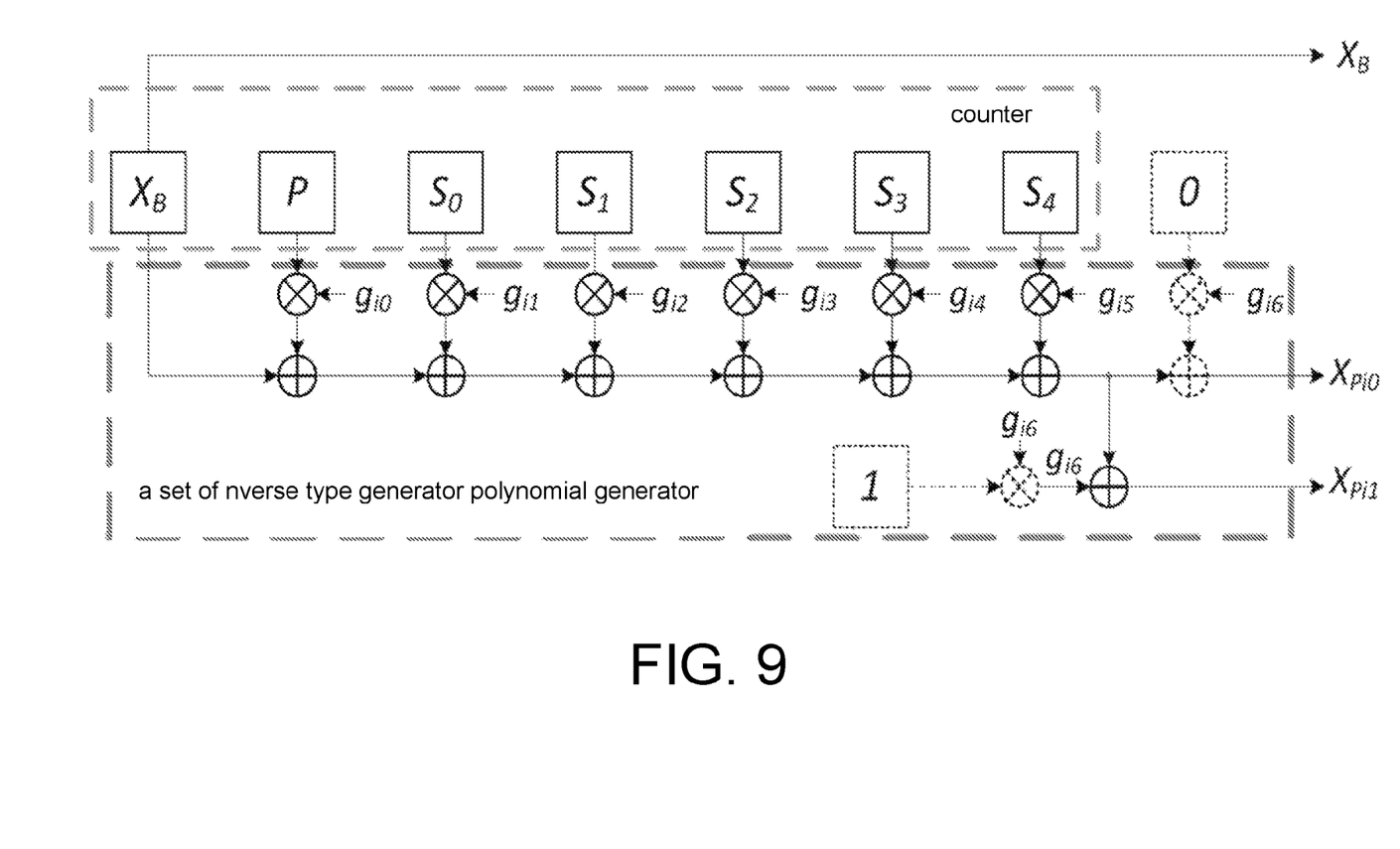
FIG. 9 illustrates one trellis router with six memory units and two extension factors for application in the context of LTE convolutional codes according to one embodiment of the present invention.

For instance, a smart phone uses LTE turbo codes and covolutional codes, and also uses WiMAX double binary turbo codes. Please refer to FIG. 9. FIG. 9 illustrates one trellis router with six memory units and two extension factors for application in the context of LTE convolutional codes according to one embodiment of the present invention. As shown in FIG. 9, in order to support LTE convolutional codes when the constraint length is seven and the number of memory units is six, the present invention makes the memory units corresponding to the decoder to be a binary counter before decoding starts. The counter starts counting from zero to the maximum value. The values during the counting period are input values to the inverse type generator polynomial such as the equation $g_{in}$. The decoding route needed by a Maximum a-posteriori probability decoder or a Viterbi decoder could be available at the output of the trellis router. The decoding process afterwards is being processed according to the route arrangement metrics generated by this invention. No extra calculation is needed. Thus, no additional calculation time would be generated. The additional calculation time of this present invention only includes the counting before the decoding starts.

Because a trellis router for application in LTE convolutional codes and WiMAX double binary turbo codes has 8 memory units, the setup time before decoding starts needs $2^8=256$ cycles. This could cause relatively high latency among the switches between various communications standards. The present invention could set different extension factors (Fu) according to different throughput demands. Each extension factor could split one of the memory units in the binary counter into 1 or 0, and at the same time could output the values in the two scenarios to the inverse type generator polynomial. That is, two routes are set at the same time for the trellis router. Thus, when the extension factor (originally 1) doubles, the calculation time is reduced to half. When the extension factor is Fu, the calculation time is ½ Fu of the original time. By taking this approach, when extension factors are small, the area overhead is somewhat reduced because registers and operands are reduced.

Figure 10:
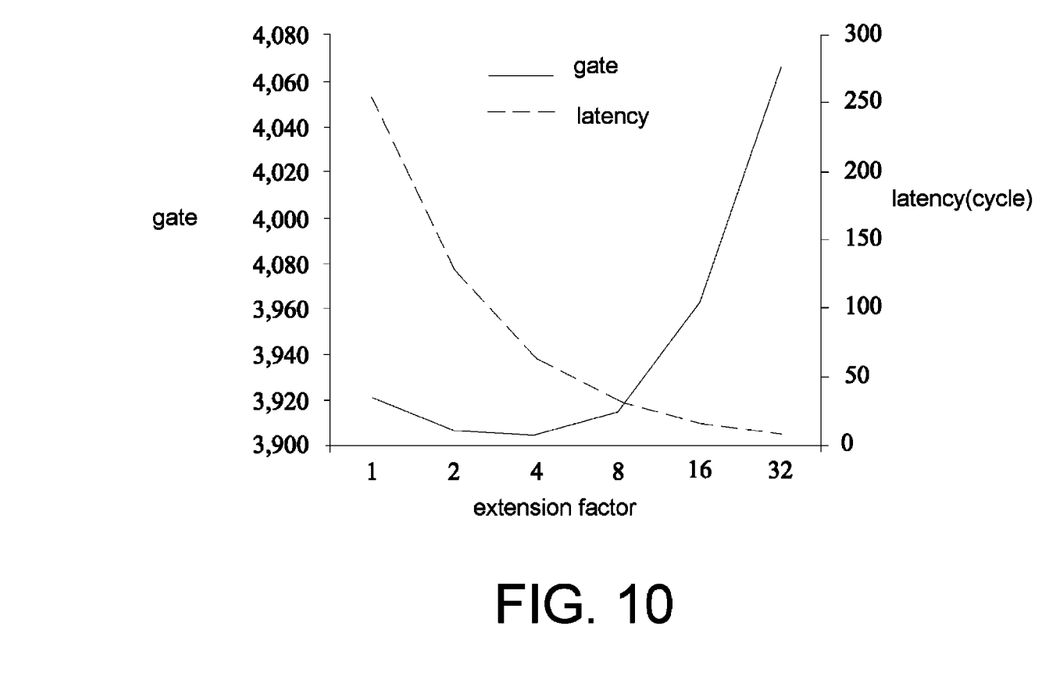
FIG. 10 illustrates the extra cost of time and space for trellis routers according to one embodiment of the present invention.

Please refer to FIG. 10. FIG. 10 illustrates the extra cost of time and space for trellis routers according to one embodiment of the present invention. Table 1 illustrates area overhead and latency of trellis routers for different extension factors. As the extension factors become larger, the hardware cost of the trellis router increases. As shown in Table 1 and FIG. 10, the hardware cost (number of gates) and setup time (latency) change along the extension factors. Thus, in this example, suppose the acceptable latency is 8 cycles, then the extension factor has to be 32.

TABLE 1 the area overhead and latency of trellis routers for different extension factors

| extension factor $F_u$ | 1 | 2 | 4 | 8 | 16 | 32 |
|---|---|---|---|---|---|---|
| area overhead of trellis router (gates) | 3921 | 3906 | 3904 | 3915 | 3961 | 4066 |
| latency (cycles) | 256 | 128 | 64 | 32 | 16 | 8 |

TABLE 2 the extra area overhead generated at each cycle for different standards and the decoding capability of the decoder when the latency is 8

| decoder design | [2] (CC) | [3] (SB/DB TC) | [4] (SB TC) |
| --- | --- | --- | --- |
| chip area (mm$^2$) | 0.77 | 3.38 | 1.66 |
| constraint length of decoder | 7 | 4 | 4 |
| extension factor $F_u$ | 32 | 1 | 1 |
| additional area | 1.84% | 0.03% | 0.06% |

Table 2 illustrates the extra area overhead generated at each cycle for different standards and the decoding capability of the decoder when the latency (cycle) is 8. Although the hardware cost with large extension factors may increase rapidly, the extra hardware cost of this invention still is very low when it is compared with the single standard decoder currently available in the market. As shown in [2], [3], and [4], the extra areas of the programmable generalized trellis routers setup based on different standards and decoding capabilities of decoders when the latency is 8 cycles are 1.84%, 0.03%, and 0.06% respectively.

The trellis router of the present invention could rearrange survival routes or trellis routes in the decoder for various encoders, so a Viterbi decoder or a Maximum a-posteriori probability decoder could decode non-restricted single binary or double binary convolutional codes or turbo codes. The present invention could also reduce setup time, simply taking several cycles to finish the setup. No additional calculation would occur during the coding process. The maximum extra area overhead of the present invention is less than 2%.

The present invention has very small overhead. The way how a trellis router works is to rearrange the route in the decoder before the start of the codeword decoding, so it can be used for the following decoding process. In the case of small constraint length, the calculation time is relatively short, but in the case of larger constraint length, the setup time of the router becomes long. For example, the constraint length of the LTE convolutional code is 7, and the setup time of the router is $2^7=128$ cycles, thus making the throughput of the decoder decreases dramatically when there are a lot of switches between communications standards. The present invention allows the user to preset the lowest cycle number the user desires. Based on different extension factors, the setup time decreases in the power of 2. The lowest value could be one cycle to set up all routes once. Thus, according to one embodiment of the present invention, when values of one or more of memory units are given, the time needed for expansion and counting of the inverse type generator polynomial is shortened.

Figure 11:
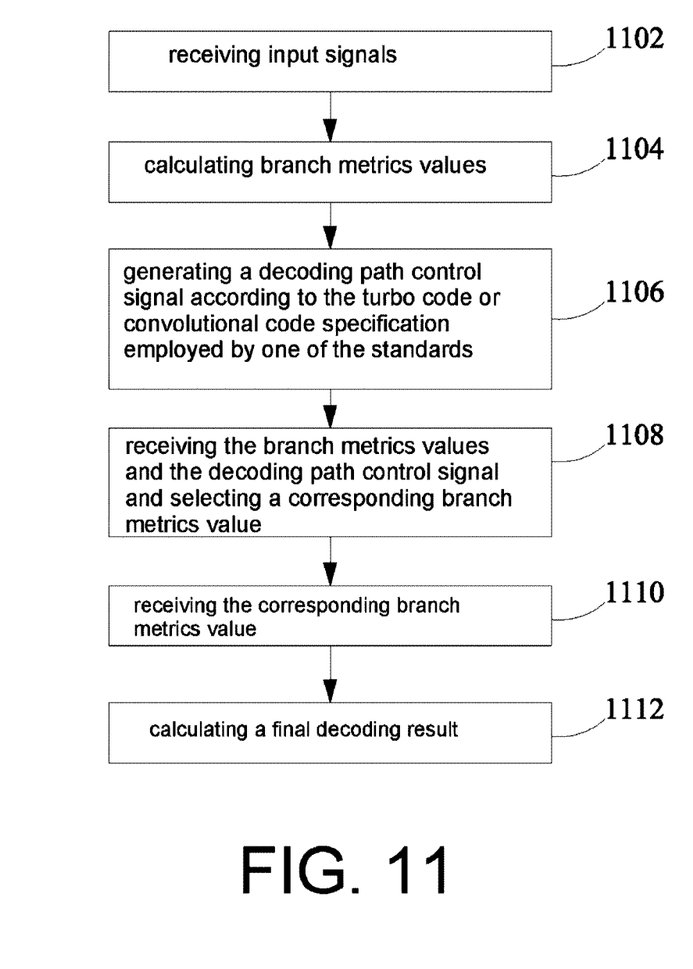
FIG. 11 illustrates one example of the decoding path selection method for decoding codewords generated by convolutional codes or turbo codes encoders in error correction codes according to one embodiment of the present invention.

Please refer to FIG. 11. FIG. 11 illustrates one example of the decoding path selection method for decoding codewords generated by convolutional codes or turbo codes encoders in error correction codes according to one embodiment of the present invention. The decoding path selection method includes the following steps:
step 1102, receiving input signals;
step 1104, calculating branch metrics values;
step 1106, generating a decoding path control signal according to the turbo code or convolutional code specification employed by one of communications standards;
step 1108, receiving the branch metrics values and the decoding path control signal and selecting a corresponding branch metrics value;
step 1110, receiving the corresponding branch metrics value; and
step 1112, calculating a final decoding result.

Figure 12:
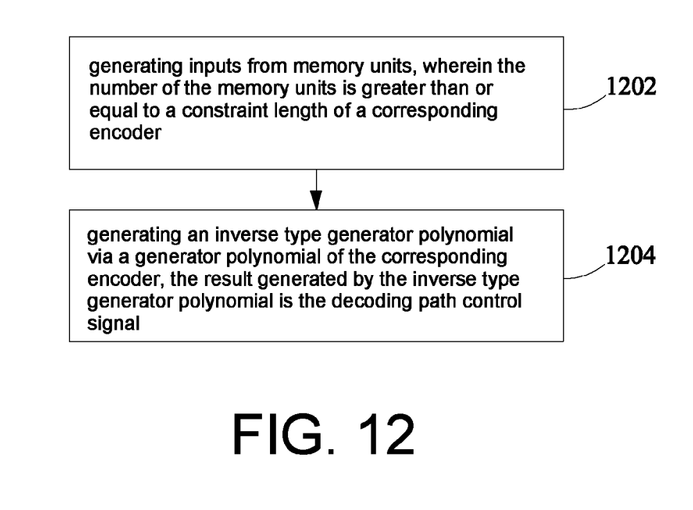
FIG. 12 illustrates steps for generating decoding path control signals for application in single binary encoding.

Please refer to FIG. 12. FIG. 12 illustrates steps for generating decoding path control signals for application in single binary encoding. In the embodiment of single binary encoding, the step of generating the decoding path control signal includes the following steps:
step 1202, generating inputs from memory units, wherein the number of the memory units is greater than or equal to a constraint length of a corresponding encoder; and
step 1204, generating an inverse type generator polynomial via a generator polynomial of the corresponding encoder, the result generated by the inverse type generator polynomial is the decoding path control signal.

Figure 13:
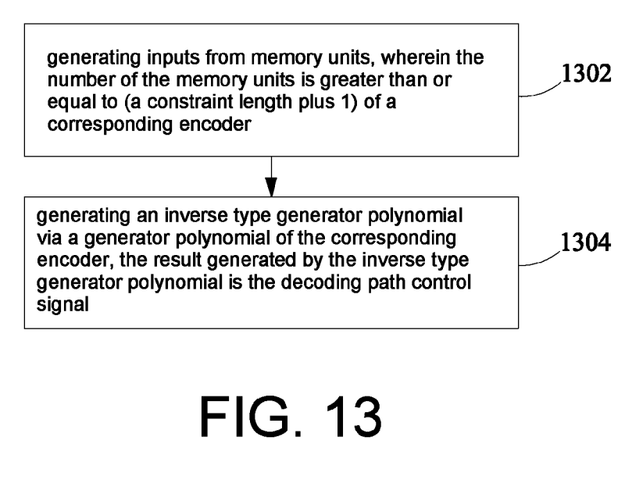
FIG. 13 illustrates steps for generating decoding path control signals for application in double binary encoding.

Please refer to FIG. 13. FIG. 13 illustrates steps for generating decoding path control signals for application in double binary encoding. In the embodiment of double binary encoding, the step of generating the decoding path control signal includes the following steps:
step 1302, generating inputs from memory units, wherein the number of the memory units is greater than or equal to (a constraint length plus 1) of a corresponding encoder; and
step 1304, generating an inverse type generator polynomial via a generator polynomial of the corresponding encoder, the result generated by the inverse type generator polynomial is the decoding path control signal.

Codewords generated by different recursive systematic convolutional encoders or non-recursive non-systematic convolutional encoders would generate different branch values at the decoding end. Thus, rearranging the branch values originally arranged by the decoder at the decoding end could allow the decoder to decode the received codewords back to the information at the sender normally. Design another decoder could dramatically increase the overall hardware cost; however, by the aforementioned approach, there is no need to additionally design a decoder.

In conclusion, the aforementioned embodiments disclose a decoding path selection device and method for decoding codewords generated by convolutional codes encoders or turbo codes encoders in error correction codes. By using the device or method presented by this invention, the number of memory units could be adjusted according to the way in which it is applied, and it could also be used in the standard of the double binary decoder. The most important aspect of this invention is that this invention could be used in the turbo code decoder, which has better error correction capability and wider application. When this invention is applied in turbo decoders, turbo codes of various standards could be decoded. Convolutional codes could also be decoded. This invention supports error correction codes of various kinds, thus the design complexity of multi-mode error correction decoders decreases dramatically.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, future modifications to the embodiments of the present invention cannot depart from the technical scope of the present invention.

What is claimed is:
1. A decoding path selection device for decoding codewords generated by convolutional codes encoders or turbo codes encoders in error correction codes, the decoding path selection device comprising:
 a branch metrics calculation unit for receiving a plurality of incoming signals and calculating a plurality of branch metrics values;
 a programmable generalized trellis router for generating a decoding path control signal according to the turbo code or convolutional code specification employed by one of a plurality of standards;

a multiplexer for receiving the branch metrics values from the branch metrics calculation unit and the decoding path control signal from the programmable generalized trellis router and selecting a corresponding branch metrics value;

a recursive calculation unit, connected after the multiplexer and for receiving the corresponding branch metrics value from the multiplexer; and an a-posteriori probability calculation unit, connected after the recursive calculation unit and for calculating a final decoding result.

2. The decoding path selection device of claim 1, wherein the programmable generalized trellis router comprises:

a counter, comprising a plurality of memory units, the number of the memory units is greater than or equal to a constraint length of a corresponding encoder; and an inverse type generator polynomial generator for receiving a plurality of inputs from the memory units and generating an inverse type generator polynomial via a generator polynomial of the corresponding encoder, the result generated by the inverse type generator polynomial is the decoding path control signal.

3. The decoding path selection device of claim 2, wherein the decoding path selection device is configured to be adapted to a Viterbi decoder.

4. The decoding path selection device of claim 3, wherein the Viterbi decoder further comprises a path tracking module.

5. The decoding path selection device of claim 2, wherein the decoding path selection device is configured to be adapted to a Maximum a-posteriori probability decoder.

6. The decoding path selection device of claim 2, wherein one or more of the values of the memory units are given in order to shorten the time needed for expansion and counting of the inverse type generator polynomial.

7. The decoding path selection device of claim 2, wherein the inverse type generator polynomial supports a turbo code.

8. The decoding path selection device of claim 7, wherein the inverse type generator polynomial supports a recursive or non-recursive, systematic or non-systematic convolutional encoder.

9. The decoding path selection device of claim 2, wherein the inverse type generator polynomial supports a convolutional code.

10. The decoding path selection device of claim 9, wherein the inverse type generator polynomial supports a recursive or non-recursive, systematic or non-systematic convolutional encoder.

11. The decoding path selection device of claim 1, wherein the programmable generalized trellis router supports a Radix-4 and Radix-2 architecture.

12. A decoding path selection method for decoding codewords generated by convolutional codes or turbo codes encoders in error correction codes, the decoding path selection method comprising:

receiving a plurality of input signals;

calculating a plurality of branch metrics values;

generating a decoding path control signal according to the turbo code or convolutional code specification employed by one of a plurality of standards;

receiving the branch metrics values and the decoding path control signal and selecting a corresponding branch metrics value;

receiving the corresponding branch metrics value; and calculating a final decoding result.

13. The decoding path selection method of claim 12, wherein the step of generating the decoding path control signal comprises the following steps:

generating a plurality of inputs from a plurality of memory units, wherein the number of the memory units is greater than or equal to a constraint length of a corresponding encoder; and generating an inverse type generator polynomial generator via a polynomial of the corresponding encoder, the result generated by the inverse type generator polynomial is the decoding path control signal.

14. The decoding path selection method of claim 13, wherein one or more of the values of the memory units are given in order to shorten the time needed for expansion and counting of the inverse type generator polynomial.

15. The decoding path selection method of claim 13, wherein the inverse type generator polynomial supports a turbo code.

16. The decoding path selection method of claim 15, wherein the inverse type generator polynomial supports codewords generated by a recursive or non-recursive, systematic or non-systematic convolutional encoder.

17. The decoding path selection method of claim 13, wherein the inverse type generator polynomial supports a convolutional code.

18. The decoding path selection method of claim 17, wherein the inverse type generator polynomial supports codewords generated by a recursive or non-recursive, systematic or non-systematic convolutional encoder.

* * * * *